United States Patent
Fung et al.

(10) Patent No.: US 7,853,911 B1
(45) Date of Patent: Dec. 14, 2010

(54) METHOD AND APPARATUS FOR PERFORMING PATH-LEVEL SKEW OPTIMIZATION AND ANALYSIS FOR A LOGIC DESIGN

(75) Inventors: Ryan Fung, Mississauga (CA); Vaughn Betz, Toronto (CA); David Karchmer, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 734 days.

(21) Appl. No.: 11/267,655

(22) Filed: Nov. 4, 2005

(51) Int. Cl.
*G06F 17/50* (2006.01)
*G06F 9/45* (2006.01)
*H03K 19/00* (2006.01)

(52) U.S. Cl. .................. 716/6; 716/1; 716/2; 716/4; 716/5; 716/10; 716/17; 716/18

(58) Field of Classification Search .......... 716/2, 716/6, 10, 12, 13, 17; 713/503; 326/28, 326/39, 93, 96
See application file for complete search history.

(56) References Cited

U.S. PATENT DOCUMENTS

| | | | |
|---|---|---|---|
| 6,218,864 B1 * | 4/2001 | Young et al. .................. 326/93 |
| 6,466,008 B1 * | 10/2002 | Fung et al. ............... 324/158.1 |
| 6,550,045 B1 * | 4/2003 | Lu et al. ........................ 716/6 |
| 6,744,285 B2 * | 6/2004 | Mangum et al. .............. 326/96 |
| 6,782,519 B2 * | 8/2004 | Chang et al. .................... 716/6 |
| 6,910,196 B2 * | 6/2005 | Cocchini ....................... 716/6 |
| 6,948,142 B2 * | 9/2005 | Tetelbaum et al. ............. 716/6 |
| 7,002,369 B2 * | 2/2006 | Natarajan et al. ............. 326/39 |
| 7,047,504 B2 * | 5/2006 | Kawano ........................ 716/2 |
| 7,107,477 B1 * | 9/2006 | Singh et al. ................. 713/503 |
| 7,178,124 B1 * | 2/2007 | Makarov et al. .............. 716/12 |
| 7,228,517 B2 * | 6/2007 | Katayose ..................... 716/10 |
| 7,254,789 B1 * | 8/2007 | Fung et al. ..................... 716/2 |
| 7,290,232 B1 * | 10/2007 | Fung et al. ..................... 716/6 |
| 7,296,246 B1 * | 11/2007 | Kuehlmann et al. ........... 716/2 |
| 7,302,657 B2 * | 11/2007 | Lindkvist ....................... 716/6 |
| 7,559,040 B1 * | 7/2009 | Albrecht et al. ................ 716/2 |
| 7,624,364 B2 * | 11/2009 | Albrecht et al. ................ 716/6 |
| 2004/0123259 A1 * | 6/2004 | You et al. ....................... 716/6 |
| 2006/0080632 A1 * | 4/2006 | Ng et al. ....................... 716/17 |
| 2007/0035428 A1 * | 2/2007 | Badaroglu .................. 341/143 |
| 2007/0204252 A1 * | 8/2007 | Furnish et al. ................ 716/10 |
| 2007/0234266 A1 * | 10/2007 | Chen et al. .................... 716/13 |

OTHER PUBLICATIONS

Neves et al.; "Optimal clock skew scheduling tolerant to process variations"; Jun. 3-7, 1996; Design Automation; Conference Proceedings 1996, 33rd; pp. 623-628.*

Harris et al.; "Statistical clock skew modeling with data delay variations"; Dec. 2001; Very Large Scale Integration (VLSI) Systems, IEEE Transactions on; vol. 9, Issue 6, pp. 888-898.*

Kwang-Ki et al.; "Skew optimization by combining tree-based and graph-based techniques for high performance clock routing"; Oct. 26-27, 1999 ; VLSI and CAD, 1999. ICVC '99. 6th International Conference on; pp. 407-410.*

(Continued)

*Primary Examiner*—Helen Rossoshek
(74) *Attorney, Agent, or Firm*—L. Cho

(57) ABSTRACT

A method for designing a system including optimizing path-level skew in the system and analyzing path-level skew in the system. Other embodiments are also disclosed.

36 Claims, 20 Drawing Sheets

OTHER PUBLICATIONS

Singh et al.; "Constrained clock shifting for field and programmable gate arrays"; Feb. 2002; FPGA '02; Proceedings of the 2002 ACM/SIGDA tenth international synposium on Field-programmable gate arrays' ACM.*

Fung et al.; "Simultaneous short-path and long-path timing optimization for FPGAs"; Nov. 7-11, 2004; Computer Aided Design, 2004. ICCAD-2004. IEEE/ACM International Conference on; pp. 838-845.*

El-Amawy et al.; "On the complexity of designing optimal branch-and-combine clock networks"; Feb. 1998; Computers, IEEE Transactions on; vol. 47, Issue 2, pp. 264-269.*

Ravindran et al.; "Multi-domain clock skew scheduling"; Nov. 9-13, 2003; Computer Aided Design, 2003. ICCAD-2003. International Conference on; pp. 801-808.*

Schmid et al.; "Advanced synchronous scan test methodology for multi clock domain ASICs"; Publication Year: 1999; VLSI Test Symposium, 1999. Proceedings. 17th IEEE; pp. 106-113.*

Albrecht et al.; "Cycle time and slack optimization for VLSI-chips"; Publication Year: 1999; Computer-Aided Design, 1999. Digest of Technical Papers. 1999 IEEE/ACM International Conference on; pp. 232-238.*

Yeh et al.; "Delay budgeting in sequential circuit with application on FPGA placement "; Publication Year: 2003; Design Automation Conference, 2003. Proceedings; pp. 202-207.*

* cited by examiner

METHOD AND APPARATUS FOR PERFORMING PATH-LEVEL SKEW OPTIMIZATION AND ANALYSIS FOR A LOGIC DESIGN

TECHNICAL FIELD

The present invention relates to logic design automation. More specifically, the present invention relates to a method and apparatus for performing path-level skew optimization in a logic design tool and analyzing path-level skew in a logic design.

BACKGROUND

To communicate timing performance targets to logic design tools (or electronic design automation, EDA, tools) for field programmable logic devices (FPGAs), designers specify timing constraints such as, for example, clock period constraints, IO $T_{SETUP}$ requirements, and IO $T_{HOLD}$ requirements. Based on these timing constraints, EDA tools attempt to generate design implementations which satisfy user performance targets. EDA tools also report whether the specified timing constraints have been satisfied so the designer can take steps, if necessary, to try to improve the design implementation. The designer may, for example, change EDA tool settings or impose constraints, such as placement and routing constraints, on the EDA tool.

Clock period timing constraints may be specified as performance targets. The minimum clock period for a given register-to-register path in a design is primarily a function of three delays: the maximum path delay between the two registers, the maximum path delay from the clock to the source register, and the minimum path delay from the clock to the destination register. The difference between the last two components is typically referred to as the clock skew for the two respective registers. Minimizing the maximum path delay between the two registers to minimize the clock period is the focus of most EDA optimization. EDA tools often ignore clock skew between registers during optimization, because clock signals are typically distributed on low-skew routing resources or networks. Low-skew routing resources ensure that clocks will be distributed with low "predictable" skew to allow optimization tools to focus on register-to-register delays when attempting to satisfy clock period constraints. However, when designs have more clocks than the number of available low-skew networks, some clocks need to be distributed using regular resources that are not specifically designed to be low-skew and this motivates low-skew optimization techniques and analysis.

Some inter-chip board-level communication standards rely on low-skew transfers where the goal is to have signals arrive at approximately the same time regardless of the absolute time it takes the signals to travel from source to destination. To support design implementation for these standards, low-skew optimization techniques and analysis methods are beneficial.

There are other instances, when low-skew (or zero-skew) is not of interest and so dedicated resources can not often be employed. Instead the designer would like to enforce a particular skew schedule and, in those cases, path-level low-skew optimization and analysis techniques that address skew schedules are of interest.

For the purposes of this application, low-skew or zero-skew requirements (or constraints) will be referred to as simple skew requirements (or constraints). When skew schedules are involved, those respective constraints will be referred to as complicated skew constraints. Complicated skew constraints have two types of skew schedules: source skew schedules and destination skew schedules. A source skew schedule specifies how much slower paths from different sources should be with respect to one another, for any given destination. For example, a source skew schedule may be that all paths starting on source node A are X ps slower than all paths starting on source node B, for any given destination node. The reason that the schedule only applies for any arbitrary destination node, rather than across all destination nodes, is because source skew schedules may be used with destination skew schedules. A destination skew schedule specifies how much slower the paths ending at different destinations should be with respect to one another, for any given source. For example, a destination skew schedule may be that all paths ending on destination node C are Y ps slower than all paths ending on destination node D, for any given source node. Simple skew constraints are a subset of complicated skew constraints with zero source and zero destination skew schedules, which is equivalent to no source and destination skew schedules (with source and destination skew schedules that specify that the delays of all paths emerging from sources should be equal and the delays of all paths ending at destinations should be equal). It should be noted that a source skew schedule can apply across all destination nodes rather than only for any arbitrary destination node if a zero destination skew schedule is specified. Similarly, it should be noted that a destination skew schedule can apply across all source nodes rather than only for any arbitrary source node if a zero source skew schedule is specified.

Before automatic path-level skew optimization techniques, designers in the past had to manually repair design implementations to satisfy skew constraints. This often required that the user manually insert logic, adjust the placement, and/or routing of the design, or redesign the system to accommodate the skew present in the design implementation.

Thus, what is needed is an efficient method and apparatus for satisfying path-level skew constraints. Also needed are path-level skew analysis techniques to help measure how well skew constraints have been satisfied.

SUMMARY

According to an embodiment of the present invention, path-level skew is managed for a system. Connection-level skew slacks are identified for a system by first identifying a maximum path delay for each skew domain (for one or more skew constraints). For each skew domain, the maximum path delay and a tolerable maximum skew are used to determine absolute maximum and minimum path-level target delays for the skew domain. Long-path and short-path connection-level skew slacks are generated from a set of connection delays and the absolute maximum and minimum path-level target delays for each skew domain. The long-path and short-path connection-level skew slacks may be used to generate minimum and maximum connection-level delay budgets, for the overall design, to guide an optimization procedure to satisfy the one or more skew constraints. Techniques for analyzing and reporting path-level skew are also discussed so that designers can receive feedback as to how well a design implementation satisfies skew constraints.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

Figure 1:
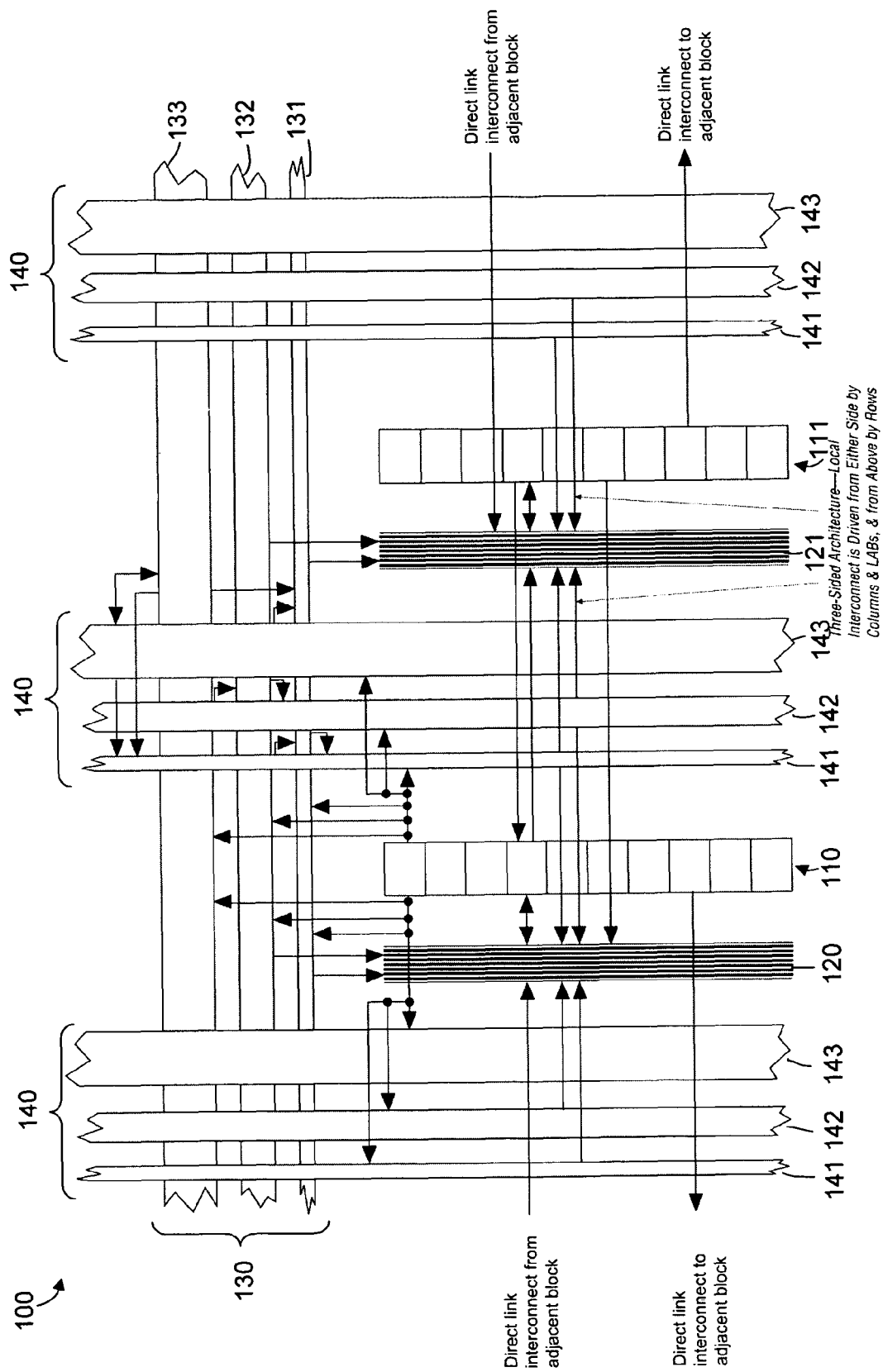
FIG. 1 illustrates a field programmable gate array (FPGA) according to an embodiment of the present invention.

FIG. 1 illustrates an exemplary target device 100 (FPGA) according to an embodiment of the present invention. The present invention may be used to design a system onto the target device 100. According to one embodiment, the target device 100 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 100, an LE may include a 4-input lookup table (LUT) with a configurable flip-flop.

The target device 100 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 100. A first column of LABs is shown as 110 and a second column of LABs is shown as 111.

The target device 100 includes memory blocks (not shown). The memory blocks may be, for example, dual-port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 100.

The target device 100 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 100.

The target device 100 includes a plurality of input/output elements (IOEs) (not shown). Each IOE feeds an I/O pin (not shown) on the target device 100. The IOEs are located at the end of LAB rows and columns around the periphery of the target device 100. Each IOE includes a bidirectional I/O buffer and a plurality of registers for registering input, output, and output-enable signals. When used with dedicated clocks, the registers provide performance and interface support with external memory devices, for example.

The target device 100 includes LAB local interconnect lines 120-121 that transfer signals between LEs in the same LAB. The LAB local interconnect lines are driven by column and row interconnects and LE outputs within the same LAB. Neighboring LABs, memory blocks, IOEs, or DSP blocks may also drive the LAB local interconnect lines 120-121 through direct link connections.

The target device 100 also includes a plurality of row interconnect lines ("H-type wires") 130 that span fixed distances. Dedicated row interconnect lines 130, that include H4 131, H8 132, and H24 133 interconnects, route signals to and from LABs, DSP blocks, IOEs, and memory blocks within the same row. The H4 131, H8 132, and H24 133 interconnects span a distance of up to four, eight, and twenty-four LABs respectively, and are used for fast row connections in a four-LAB, eight-LAB, and twenty-four-LAB region. The row interconnects 130 may drive and be driven by LABs, DSP blocks, RAM blocks, and horizontal IOEs.

The target device 100 also includes a plurality of column interconnect lines ("V-type wires") 140 that operate similarly to the row interconnect lines 130. The column interconnect lines 140 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 140 include V4 141, V8 142, and V16 143 interconnects that traverse a distance of four, eight, and sixteen blocks respectively, in a vertical direction.

FIG. 1 illustrates an exemplary embodiment of a target device. It should be appreciated that a system may include a plurality of target devices, such as that illustrated in FIG. 1, cascaded together. It should also be appreciated that the target device may include programmable logic devices arranged in a manner different than that on the target device 100. A target device may also include components other than those described in reference to the target device 100. Thus, while the invention described herein may be utilized on the architecture described in FIG. 1, it should be appreciated that it may also be utilized on different architectures, such as those employed by Altera® Corporation in its APEX™, Mercury™, Stratix™, and Stratix™ II family of chips and those employed by Xilinx®, Inc. in its Virtex™, Virtex™ II, Virtex™ II Pro, and Virtex™ 4 line of chips.

Figure 2:
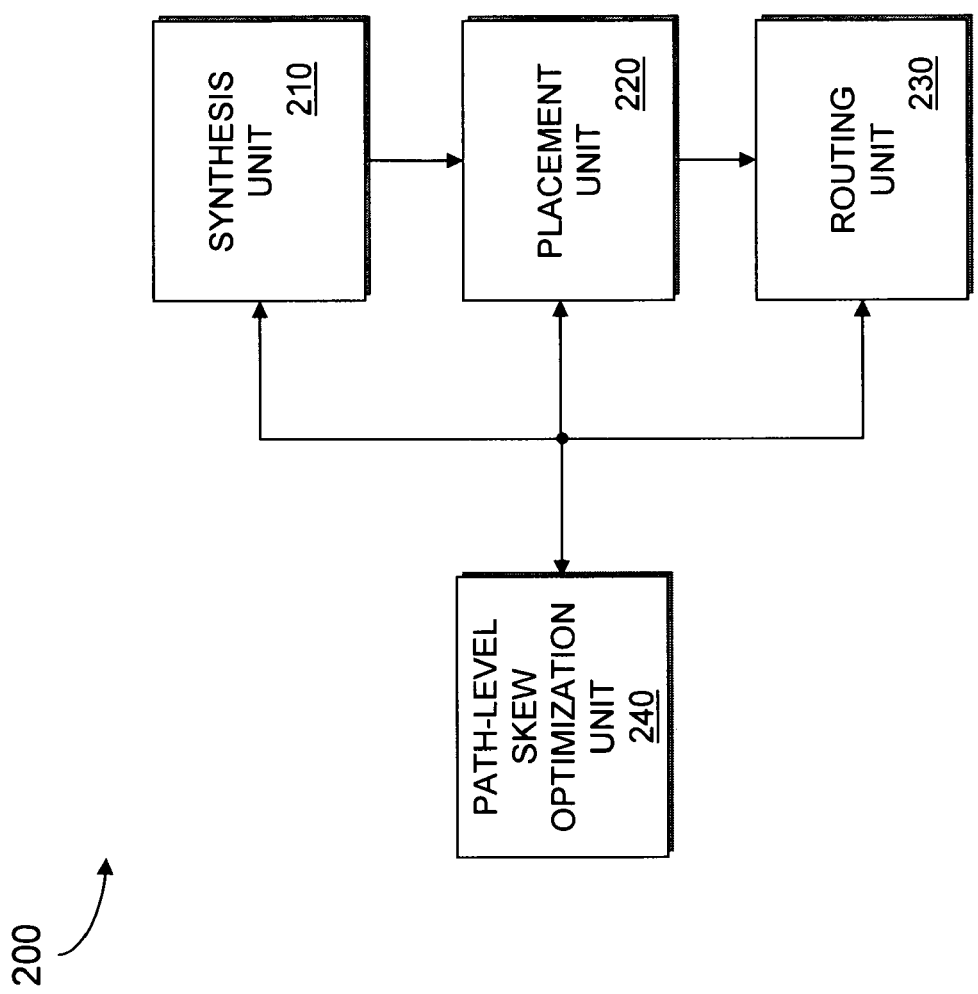
FIG. 2 illustrates a system designer according to an embodiment of the present invention.

FIG. 2 illustrates a system designer 200 according to an embodiment of the present invention. The system designer 200 may be an EDA tool. FIG. 2 illustrates software modules implementing an embodiment of the present invention. According to one embodiment, system design may be performed by a computer system (not shown) executing sequences of instructions represented by the software modules shown in FIG. 2. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software.

Block 210 represents a synthesis unit. The synthesis unit 210 generates a logic design of a system to be implemented by the target device 100 (shown in FIG. 1). According to an embodiment of the system designer 200, the synthesis unit 210 takes a conceptual Hardware Description Language (HDL) design definition and generates an optimized logical representation of the system. The optimized logical representation of the system generated by the synthesis unit 210 may include a representation that has a minimized number of functional blocks and registers, such as logic gates and logic elements, required for the system. Alternatively, the optimized logical representation of the system generated by the synthesis unit 210 may include a representation that has a reduced depth of logic and that generates a lower signal propagation delay. The synthesis unit 210 also determines how to implement the functional blocks and registers in the optimized logic representation utilizing specific resources on the target device 100, thus creating an optimized "technology-mapped" netlist. The technology-mapped netlist indicates how the resources on the target device 100 can be utilized to implement the system. The technology-mapped netlist may, for example, contain components such as LEs on the target device 100.

Block 220 represents a placement unit 220. The placement unit 220 fits the system on the target device 100 by determining which resources on the target device 100 are to be used for specific functional blocks and registers. According to an embodiment of the system designer 200, the placement unit 220 first determines how to implement portions of the optimized logic design in clusters. Clusters may represent a subset of the components on the target device 100 such as, for example, a LAB having 10 LEs. In this embodiment, after portions of the optimized logic design are implemented in clusters, the clusters may be placed by assigning the clusters to specific LABs on the target device 100. Following the placement of the clusters, routing interconnections between the LEs may be performed. The placement unit 220 may utilize a cost function in order to determine a good assignment of resources on the target device 100.

Block 230 represents a routing unit 230. The routing unit 230 determines the routing resources on the target device 100 to use to provide interconnection between the functional blocks and registers on the target device 100.

Block 240 represents a path-level skew optimization unit 240. According to an embodiment of the system designer 200, the path-level skew optimization unit 240 computes long-path and short-path connection-level skew slacks for a skew domain. The long-path and short-path connection-level skew slacks may be computed from one or more skew constraints, each constraint specifying a tolerable maximum skew. The one or more skew constraints may include one or more simple skew constraints where identified paths are targeted to have zero skew with respect to each other. Alternatively, the one or more skew constraints may include complicated skew constraints where a skew schedule specifies the relative skews between paths starting at different source nodes for any particular destination node and/or the relative skews between paths ending at different destination nodes for any particular source node. The long-path and short-path connection-level skew slacks may be used by the path-level skew optimization unit 240 to help generate minimum and maximum connection delay budgets to guide an optimization procedure used by the synthesis unit 210, the placement unit 220, and/or the routing unit 230.

Path-level skew optimization is more general than net-level skew optimization and, hence, may be more challenging to perform. For example, a net-level zero skew constraint simply specifies that all the connections of the net should have the same delay. With a path-level skew constraint, it is not apparent what the various connections delays should be (in relation to one another) to satisfy the constraint. Consequently, performing path-level skew optimization may be more challenging than performing net-level skew optimization. Since a path is defined as a series of one or more connections, path-level skew optimization is a superset of net-level skew optimization. The connections of a net, over which a net-level skew constraint is applied, can be thought of as a set of paths.

The synthesis unit 210 may utilize a synthesis strategy that adds or removes levels of logic, uses slower or faster variants of a functional block, technology maps into faster or slower standard logic structures (such as carry chains), and/or uses faster or slower logic inputs based on the minimum and maximum delay budgets. The placement unit 220 may utilize a placement strategy that places functional blocks so they can (or are forced to) use slower/faster dedicated routing resources, and/or places functional blocks at appropriate distances from other functional blocks, based on the minimum and maximum delay budgets. The routing unit 230 may utilize a routing strategy that requires more or less routing resources, slower or faster routing resources, and delay chains (or additional buffers) based on the minimum and maximum delay budgets.

Figure 3:
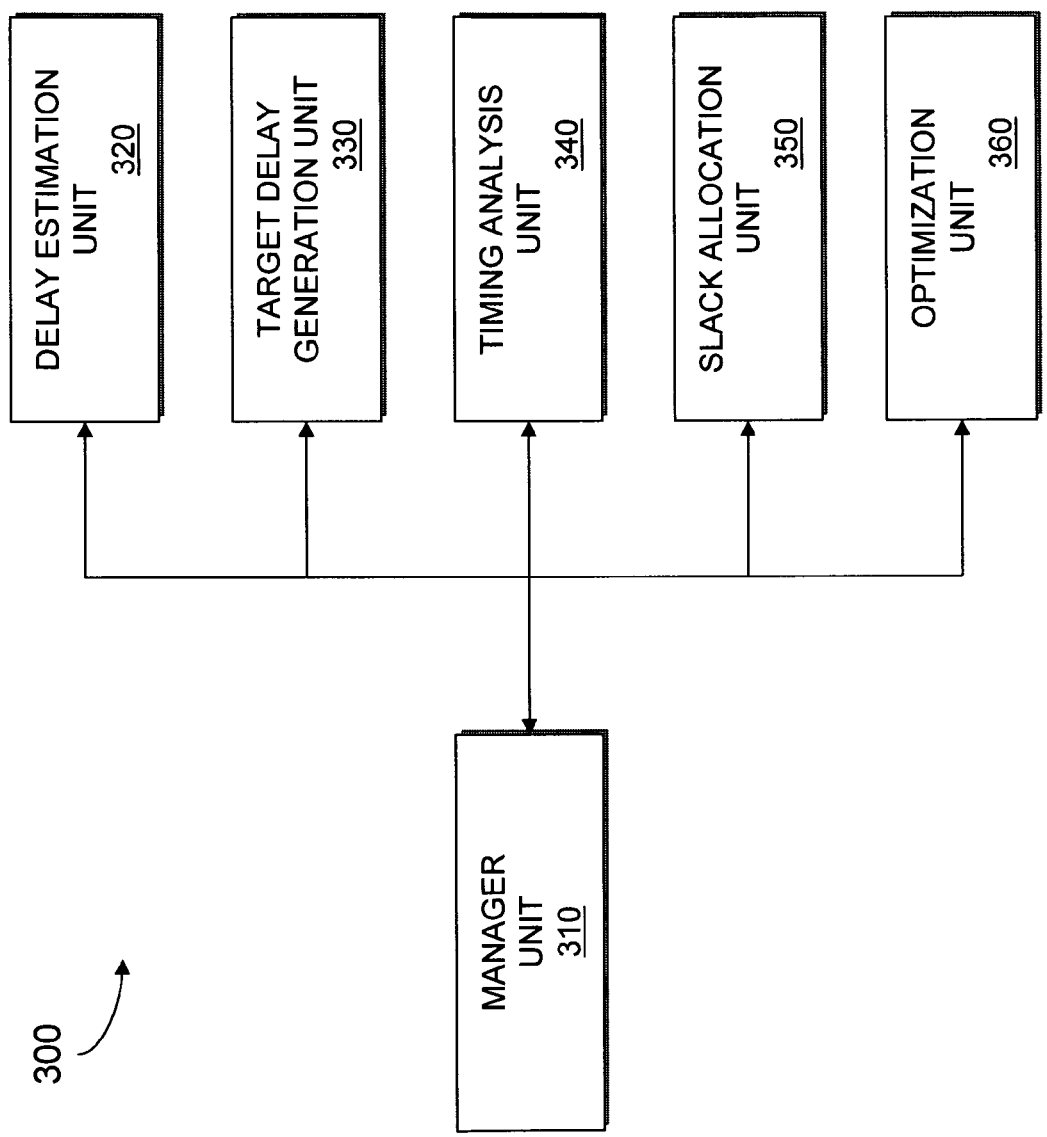
FIG. 3 is a block diagram of a path-level skew optimization unit according to an embodiment of the present invention.

FIG. 3 is a block diagram illustrating a path-level skew optimization unit 300 according to an embodiment of the present invention. The path-level skew optimization unit 300 may be used to implement the path-level skew optimization unit 240 illustrated in FIG. 2. The path-level skew optimization unit 300 includes a manager unit 310. The manager unit 310 interfaces with and transmits information between other components in the path-level skew optimization unit 300 and/or other components in a system designer. The manager unit 310 may receive one or more skew constraints from a designer or from a component in the system designer.

The path-level skew optimization unit 300 includes a delay estimation unit 320. According to an embodiment of the path-level skew optimization unit 300, the delay estimation unit 320 generates minimum achievable delay estimates for connections in a logic design. The minimum achievable delay estimates are estimates of minimum delays that could realistically be achieved in a final design. According to one embodiment, the minimum achievable delay estimates may be generated using information from components such as a synthesis unit, placement unit, and/or a routing unit. Every skew constraint is associated with a set of paths (a skew domain). For each of those skew domains, the delay estimation unit 320 also identifies the delay of a maximum delay path (M), assuming connection delays equal to the minimum achievable delay estimates.

Figure 4:
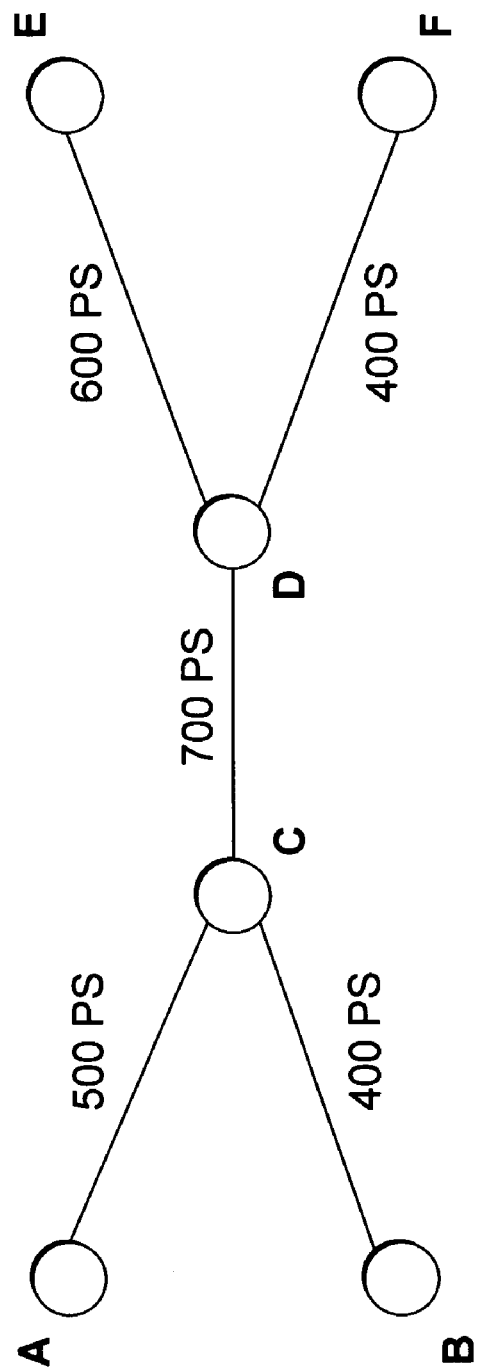
FIG. 4 illustrates an example of a timing diagram of a skew domain subject to a simple skew constraint according to an embodiment of the present invention.

According to an embodiment of the present invention, the delay estimation unit 320 identifies a maximum delay path for each skew domain subject to a simple skew constraint by performing an analysis on a timing diagram. FIG. 4 illustrates an example of a timing diagram 400 of a skew domain according to an embodiment of the present invention. The skew domain includes nodes A, B, C, D, E, and F. Nodes A and B are source nodes. Nodes E and F are destination nodes. The minimum achievable delay estimates for connections in the skew domain are shown next to the connections. When a skew domain is subject to a simple skew constraint, the maximum delay path for the skew domain may be identified by traversing the paths in the timing diagram and finding the path with the largest accumulative delay. In this example, path ACDE is the maximum delay path with a total delay of 1800 ps.

Figure 5:
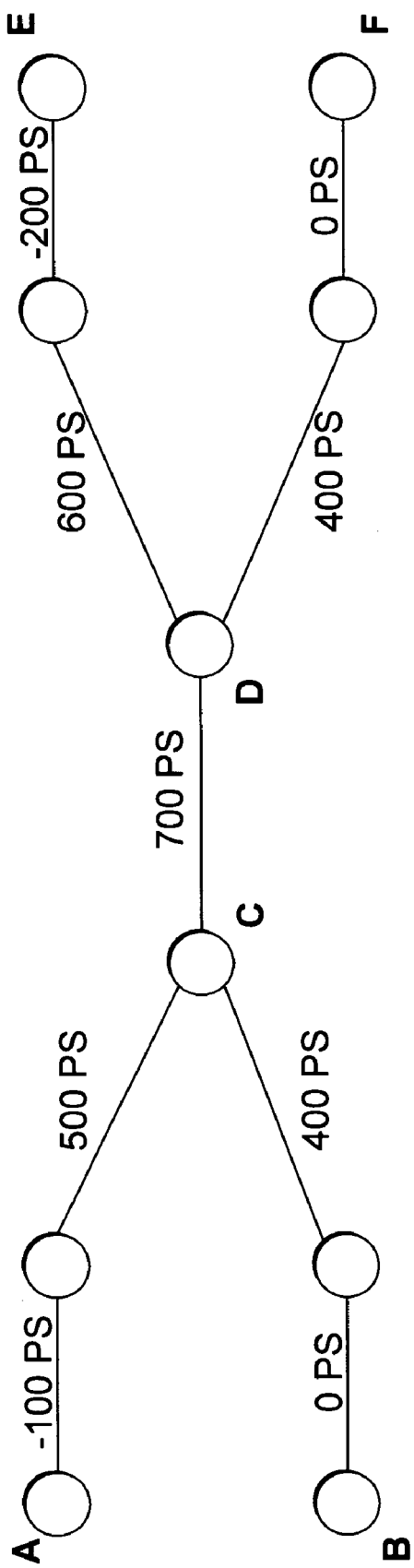
FIG. 5 illustrates an example of a modified timing diagram of a skew domain subject to a skew schedule according to an embodiment of the present invention.

According to an embodiment of the present invention, the delay estimation unit 320 identifies a maximum delay path for a skew domain subject to a complicated skew constraint by modifying the timing diagram to reflect a skew schedule and performing an analysis on the modified timing diagram. Instead of a simple skew constraint (which tries to equalize path delays within a certain tolerance), the skew domain illustrated in FIG. 4 may be subject to an arbitrary skew schedule (which tries to achieve relative path delays within a certain tolerance). For example, the skew schedule may specify that given an arbitrary destination node, all paths starting from node A and ending on the arbitrary node should be 100 ps slower than all paths starting from node B and ending on the arbitrary node. The skew schedule may further specify that given an arbitrary source node, all paths starting at the arbitrary node and ending at node E should be 200 ps slower than all paths starting at the arbitrary node and ending at node F. The timing graph shown in FIG. 4 may be modified to introduce additional delay after source node A and before destination node E as shown in FIG. 5. The delay inserted is the negative of the corresponding delay value in the skew schedule. The maximum path skew in the modified timing graph is equal to the maximum deviation from the skew schedule in the original timing graph. Consequently, when a skew domain is subject to complicated skew constraints, the timing diagram for the skew domain may modified to reflect the skew schedule, and the maximum delay path for the skew domain may be identified by traversing the paths in the modified timing diagram and finding the path with the largest accumulative delay. In this example, all paths have the same delay (equal to the maximum path delay) of 1500 ps.

Referring back to FIG. 3, the path-level skew optimization unit 300 includes a target delay generation unit 330. The target delay generation unit 330 generates a maximum target delay ($T_{MAX}$) and a minimum target delay ($T_{MIN}$) for the skew domain. The maximum target delay and minimum target delay may be enforced as the maximum and minimum delay that all paths in the skew domain should have. According to an embodiment of the target delay generation unit 330, the maximum target delay is chosen to be greater or equal to the maximum path delay and less than or equal to the maximum path delay plus the tolerable maximum skew ($M<=T_{MAX}<=M+S$), and the minimum target delay is chosen to be equal to the maximum target delay minus the tolerable maximum skew ($T_{MIN}=T_{MAX}-S$). The tolerable maximum skew (S) is the maximum deviation from zero skew that is tolerable for a simple skew constraint and the maximum tolerable deviation from the specified skew schedule for a complicated skew constraint. It should be appreciated that the maximum and minimum target delays may be generated using other techniques. In some embodiments, $T_{MAX}$ may be chosen to be a very large value (much greater than M). In theory, as along as $T_{MIN}=T_{MAX}-S$, it does not really matter how large $T_{MAX}$ is set—a skew constraint can be satisfied using many different absolute delays because only relative delays matter with regard to a skew constraint—even though it is important that $T_{MAX}>=M$ in order to ensure that all paths can be implemented with delay less than $T_{MAX}$. However, in practice, it is important to bound $T_{MAX}$ because delay estimates during optimization are often subject to percentage error, and, consequently, to minimize the potential for this error to translate into final logic design skew, keeping the path delays throughout a skew domain to a minimum is advantageous; this also helps ensure long-path constraints are met throughout a skew domain. On the contrary, it may be advantageous to increase $T_{MAX}$ above the minimum in certain embodiments. For example, short path constraints may require $T_{MAX}$ be increased; alternatively, the determination of M might use minimum achievable delay estimates which already account for (satisfy) short path timing constraints, so an appropriate $T_{MAX}$ is implicitly determined. A larger than minimum $T_{MAX}$ may also be used to increase the likelihood of achieving paths delays all less than $T_{MAX}$. It is often difficult, especially when routing in programmable logic devices, to achieve minimum routing delays on a large number of paths because minimum routing delays often require a precise set of resources be used. If the delay target is larger than the minimum routing delays, more freedom is given to the optimization algorithms to hit that target consistently.

The path-level skew optimization unit 300 includes a timing analysis unit 340. The timing analysis unit 340 generates connection-level long-path and short-path slacks from the maximum ($T_{MAX}$) and minimum ($T_{MIN}$) target delays. These connection-level slacks are referred to as connection-level skew slacks because if a design is optimized according to these long-path and short-path connection-level slacks, the design will be optimized to satisfy the corresponding skew constraints. According to an embodiment of the path-level skew optimization unit 300, the timing analysis unit 340 computes long-path connection-level skew slacks using a long-path timing analysis based on a set of connection delays and the maximum target delay for each skew domain. The timing analysis unit 340 computes short-path connection-level skew slacks using a short path timing analysis based on a set of connection delays and the minimum target delay for each skew domain. In some embodiments, the long-path and short-path connection-level skew slacks may be conservatively computed (using known techniques) from a set of connection delays where each connection has a minimum and a maximum delay bound to represent intra-chip delay modeling uncertainty and/or delay variation within the system (differences between rising versus falling signals, coupling between signal wires, etc.). In some of those embodiments, a technique called common-path pessimism removal can also be used to remove possible over-conservatism when computing long-path and short-path connection-level slacks when delay variation between portions of paths can be correlated. By using conservative long-path and short-path timing analysis approaches along these lines to produce slacks, etc., both path-level skew optimization and analysis techniques (which will be discussed in more detail later) can be made to account for delay variation and uncertainty. Another type of delay variation is inter-chip delay variation. Delay variation between chips may occur because of manufacturing (process) variations and operating condition (temperature and voltage) fluctuations. Coarse delay differences may arise because of inter-chip delay variation so design optimization and analysis needs to consider this. To model coarse delay differences, delay bounds are typically not used like they are for intra-chip delay variation because that would result in over-conservative analysis and optimization. Consequently, process and operating condition corners are introduced to model different "points" in the delay "space". By optimizing a design to meet timing at each of those timing corners, and by analyzing to verify timing is met at each of those timing corners, a design can be implemented to operate robustly in spite of process and operating condition variation. Techniques that permit timing optimization for multiple timing corners may involve using conservative scaling factors to map delays from one corner to another, in order to perform analyses at multiple corners, and may involve mapping back and amalgamating slack information at a single (primary) corner so that standard single-corner optimization techniques can be used to optimize timing for multiple corners. These same techniques can be applied to optimize skew for multiple timing corners. In particular, when figuring out the maximum delay path in a skew domain with minimum achievable delay estimates, a maximum path delay would be determined at each of the N timing corners using delay mapping techniques followed by the appropriate analyses, and the N maximum path delays can be used to compute N minimum target delays and N maximum target delays (one pair for each corner). In some embodiments, the target delays may be chosen so they "correspond" as much as possible so that, at least, some design implementations can satisfy the chosen target delays at all corners. Basically, the minimum and maximum target delay at each corner determines a timing window for that corner. The overall timing window across all corners is a function of the timing windows at each of the corners and the delay differences between corners and it is advantageous to maximize the timing window across all corners to give the optimization algorithm the most flexibility to satisfy timing. Once the target delays are chosen, they can be used to guide analyses at those respective corners and the long-path and short-path skew slacks produced can be mapped back to the primary corner and conservatively amalgamated to guide optimization as if optimization was only being done for a single timing corner. That is, single-corner optimization techniques using the amalgamated skew slack information at the primary corner will implicitly optimize skew at all timing corners.

The path-level skew optimization unit 300 includes a slack allocation unit 350. The slack allocation unit 350 generates minimum and maximum connection delay budgets from the long-path and short path connection-level skew slacks. It should be noted that after producing connection-level slacks, a connection may have several connection-level slacks associated with it, for the various timing domains (skew and otherwise) it overlaps. Consequently, an overall long-path slack and an overall short-path slack can be assigned to each connection by conservatively picking the smallest corresponding slack value for each connection. These overall long-path and short-path connection slacks can be used to help generate the minimum and maximum connection delay budgets. According to an embodiment of the path-level skew optimization unit 300, the slack allocation unit 350 iteratively allocates the connection-level slacks by calling several timing analyses and conservatively allocating the slack revealed by each timing analysis. The slack allocation unit 350 may be implemented using slack allocation unit 300 and the slack allocation techniques shown in FIGS. 3, 6, and 7 in U.S. application Ser. No. 10/774,883 filed on Feb. 9, 2004 and entitled "Method and Apparatus for Utilizing Long-Path and Short-Path Timing Constraints in an Electronic-Design-Automation Tool", herein incorporated by reference, or by any other appropriate circuitry or technique.

The path-level skew optimization unit 300 includes an optimization unit 360. The optimization unit 360 utilizes the minimum and maximum connection delay budgets to generate a strategy to satisfy the skew constraints. Since the connection level slacks are skew slacks, the strategy from the optimization unit 360 will permit the satisfaction of the respective skew constraints. It should be appreciated that the optimization unit 360 may alternatively reside in whole or in part in a synthesis unit, placement unit, and/or routing unit.

Figure 6:
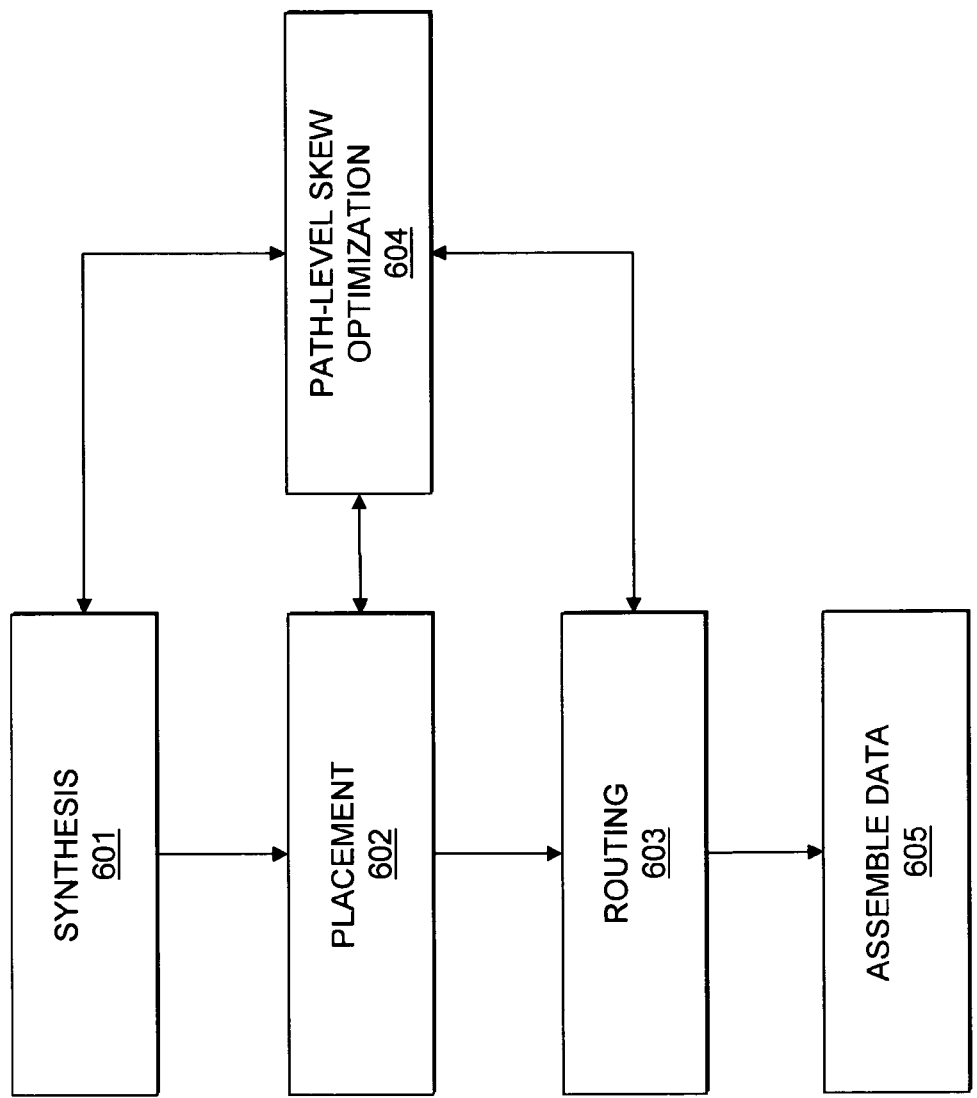
FIG. 6 is a flow chart illustrating a method for designing a system on a FPGA according to an embodiment of the present invention.

FIG. 6 is a flow chart illustrating a method for designing a system on a FPGA according to an embodiment of the present invention. At 601, the system is synthesized. Synthesis includes generating a logic design of the system to be implemented by a target device. According to an embodiment of the present invention, synthesis generates an optimized logical representation of the system from a HDL design definition. Synthesis also includes mapping the optimized logic design. Mapping includes determining how to implement logic gates and logic elements in the optimized logic representation with specific resources on the target device. According to an embodiment of the present invention, a netlist is generated from mapping. This netlist may be an optimized technology-mapped netlist generated from the HDL.

At 602, the mapped logical system design is placed. Placement works on the optimized technology-mapped netlist to produce a placement for each of the functional blocks. According to an embodiment of the present invention, placement includes fitting the system on the target device by determining which resources on the target device are to be used for specific logic elements and functional blocks.

At 603, it is determined which routing resources should be used to connect the functional blocks in the system. According to an embodiment of the present invention, routing may be performed in response to routing constraints provided.

At 604, path-level skew optimization is performed. According to an embodiment of the present invention, minimum and maximum connection delay budgets are generated in response to one or more skew constraints (that each specify a set of paths, an optional skew schedule, and a tolerable maximum skew or tolerable maximum deviation permitted from the skew schedule), other timing constraints (short-path and long-path), and minimum achievable delay estimates computed from data received by one or more of the synthesis, placement, and routing procedures 601, 602, and 603. A strategy for satisfying the one or more skew constraints may be generated in response to the minimum and maximum connection delay budgets or alternatively, the minimum and maximum connection delay budgets may be returned to one or more of the synthesis, placement, and routing procedures 601, 602, and 603 to generate a strategy for satisfying the one or more skew constraints (along with other timing constraints).

At 605, an assembly procedure is performed. The assembly procedure involves creating a data file that includes information determined by the compilation procedure described by 601-604. The data file may be a bit stream that may be used to program a target device.

Figure 7:
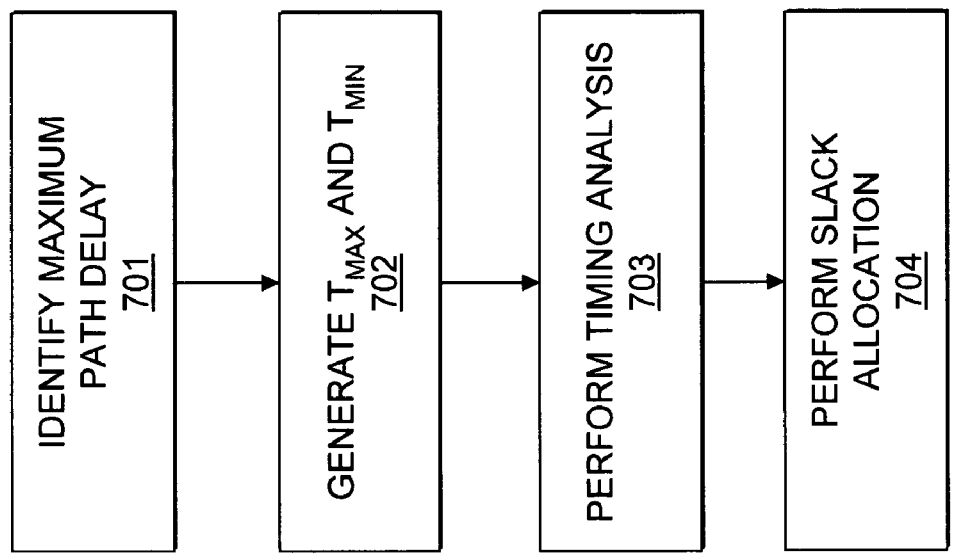
FIG. 7 is a flow chart illustrating a method for generating minimum and maximum connection-level delay budgets according to an embodiment of the present invention.

FIG. 7 is a flow chart illustrating a method for generating minimum and maximum connection delay budgets according to an embodiment of the present invention. The method shown in FIG. 7 may be implemented by 604 shown in FIG. 6. At 701, a maximum path delay in a skew domain is identified. According to an embodiment of the present invention, a timing graph is created and annotated with minimum achievable delay estimates for connections in a design for the system. The maximum path delay in the skew domain (M) may be identified by efficiently traversing the connections of the paths in the skew domain on the timing diagram to find the path with the largest accumulative delay.

At 702, absolute maximum and minimum target delays for the skew domain are generated. According to an embodiment of the present invention, the maximum target delay is chosen to be $M <= T_{MAX} <= M+S$, and the minimum target delay is chosen to be $T_{MIN} = T_{MAX} - S$. It should be appreciated that the maximum and minimum target delays may be generated independently of the maximum path delay.

At 703, timing analysis is performed. According to an embodiment of the present invention, for each skew domain, a long-path timing analysis is performed on the aforementioned timing graph to generate long-path connection-level skew slacks; the timing graph is annotated with a set of connection delays and the analysis is based on a constraint equal to the maximum target delay determined. Also, for each skew domain, a short-path timing analysis is performed on the aforementioned timing graph to generate short-path connection-level skew slacks; the timing graph is annotated with a set of connection delays and the analysis is based on a constraint equal to the minimum target delay determined.

At 704, slack allocation is performed. According to an embodiment of the present invention, slack allocation is iteratively performed considering long-path and short-path connection-level skew slacks (generated by 703) to generate minimum and maximum connection delay budgets.

Figure 8:
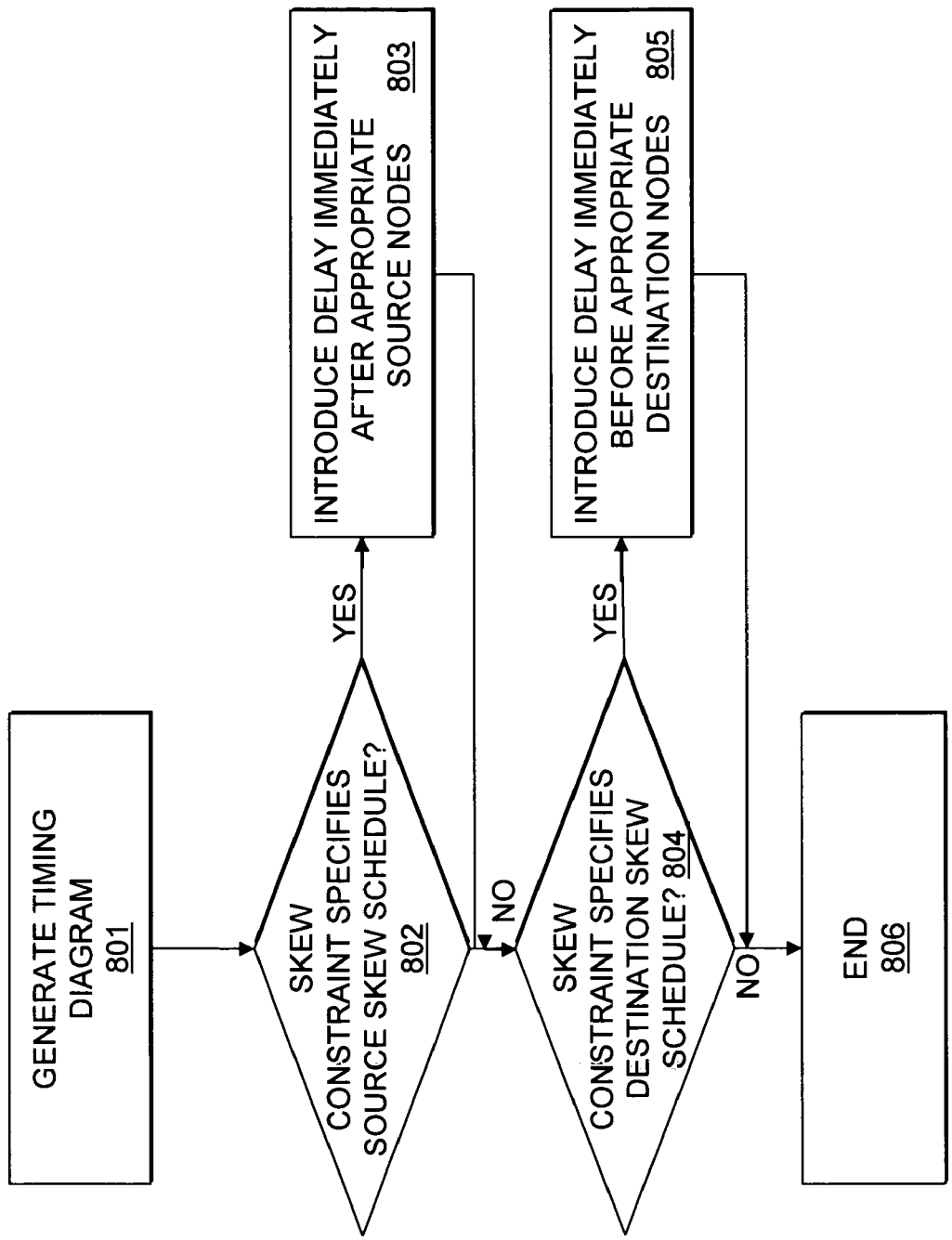
FIG. 8 is a flow chart illustrating a method for modifying a timing diagram of a skew domain subject to a skew schedule according to an embodiment of the present invention.
Figure 9A:
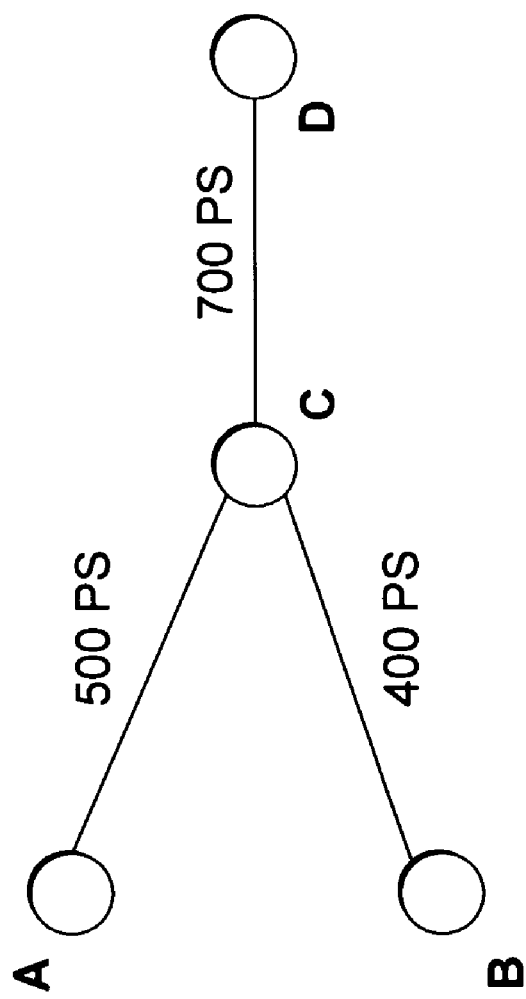
FIGS. 9(a)-(e) illustrate an example of how minimum and maximum connection delay budgets may be generated for a skew domain subject to a simple skew constraint according to an embodiment of the present invention.
Figure 9B:
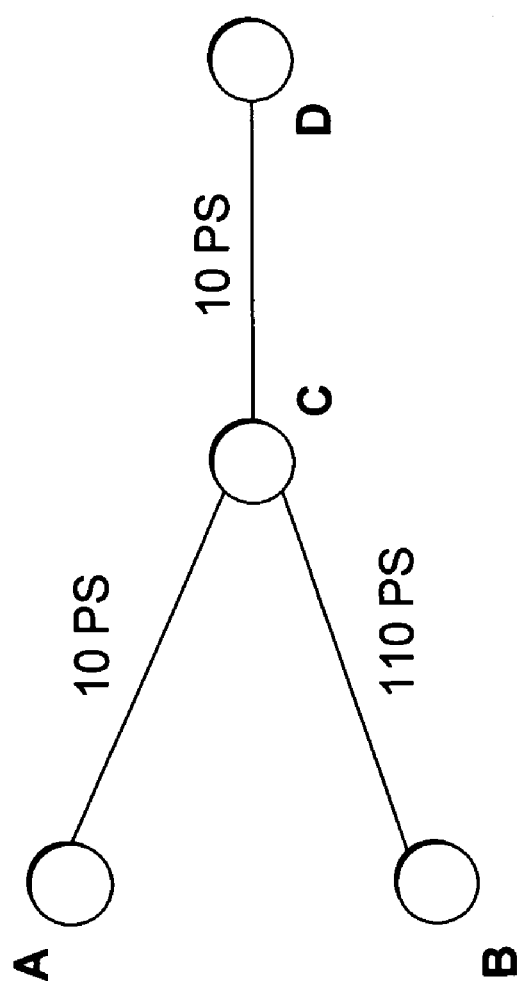
Figure 9C:
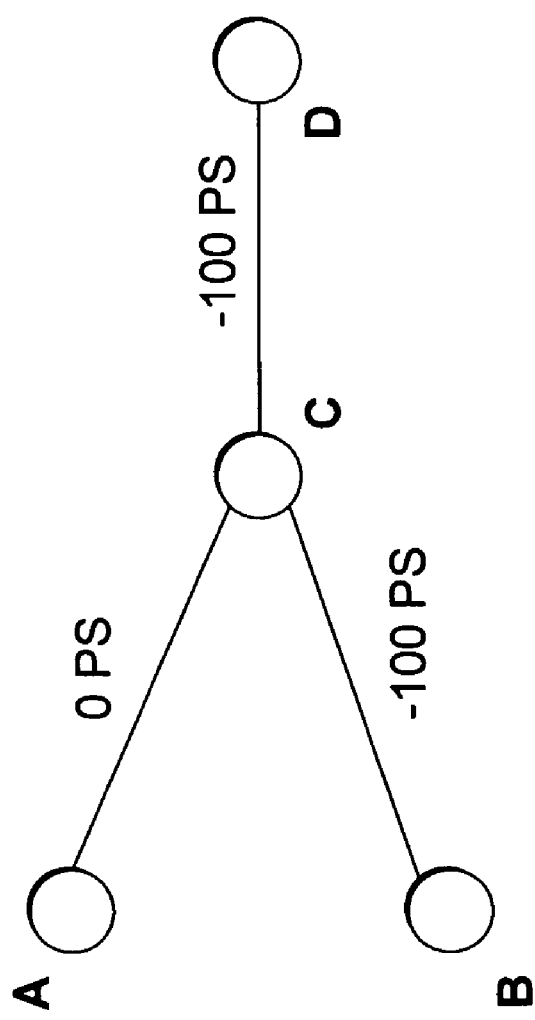
Figure 9D:
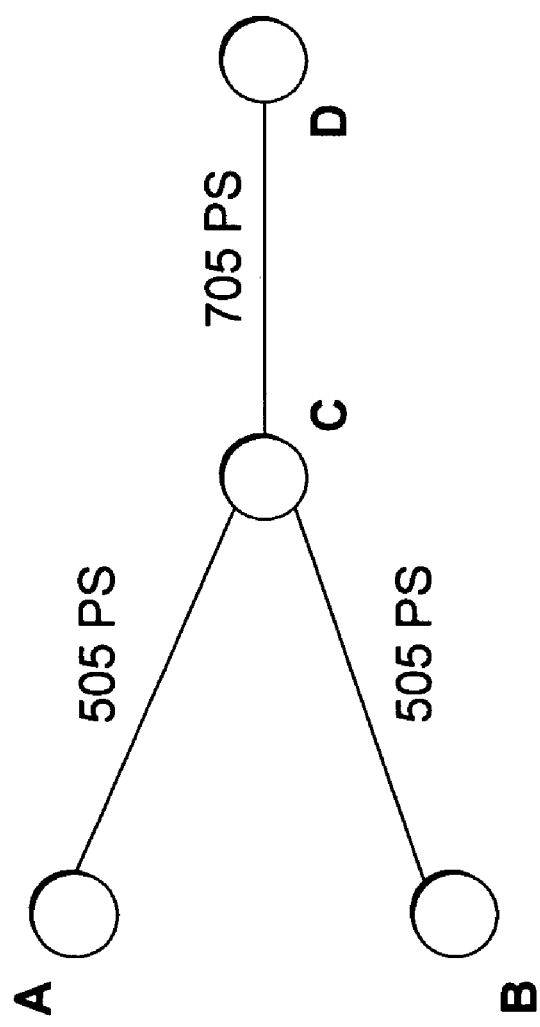
Figure 9E:
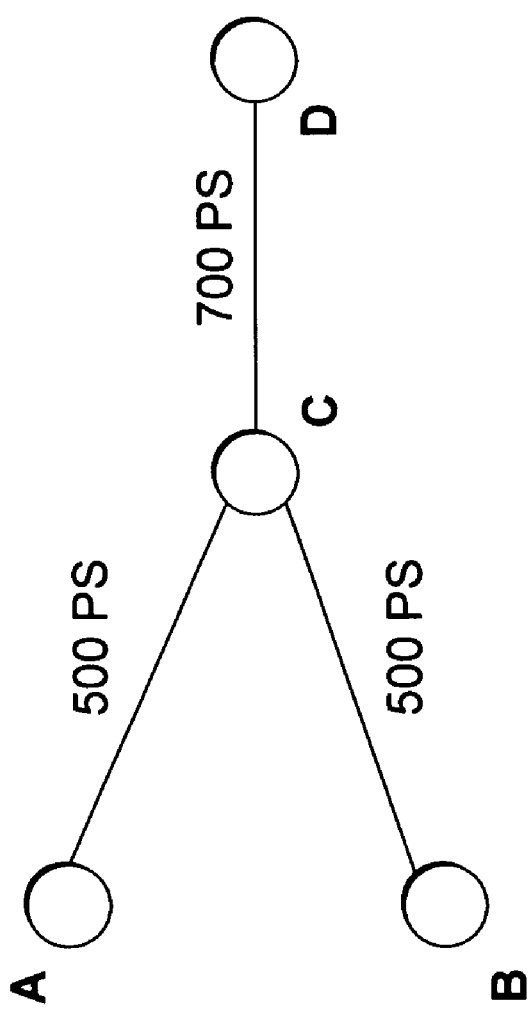

According to an embodiment of the present invention, a timing graph may be used to help compute the maximum path delay in a skew domain (701) and the short-path and long-path connection-level skew slacks (703). For simple skew constraints, no timing graph modifications need be performed when proceeding with the phases in FIG. 7. That is, the phases in FIG. 7, as they have been described so far, are designed to handle simple skew constraints. For complicated (general) skew constraints that involve a skew schedule (which specifies relative delays between paths), timing graph modifications can be performed so that the phases of FIG. 7 can be applicable to that case as well. If the appropriate modified timing graphs are used with the procedures in FIG. 7, complicated skew constraints can be handled with otherwise the same techniques as simple skew constraints. That is, attempting to achieve low or zero skew based on a modified timing graph is equivalent to trying to satisfy the actual skew schedule based on the original timing graph. FIG. 8 is a flow chart illustrating a method that enables this. The flow chart illustrates a method for modifying a timing graph for a skew domain that is subject to a skew schedule according to an embodiment of the present invention. As mentioned, modifying the timing graph facilitates timing analysis based on a skew schedule. The method of FIG. 8 may be implemented at 701 in FIG. 7 to identify a maximum path delay in a skew domain subject to a skew schedule. The maximum path delay may be identified by traversing the paths in the modified timing diagram and finding the path with the largest cumulative delay. Similarly, the modified timing graph may be used at 703. At 801, a timing graph for the design of a system is generated. The timing graph may include a plurality of paths between nodes.

At 802; it is determined whether a skew constraint specifies relative delays between paths starting at different source nodes (source skew schedule). If a source skew schedule is detected, control proceeds to 803. If a source skew schedule is not detected, control proceeds to 804.

At 803, for each appropriate source node discussed in a source skew schedule, a delay is introduced immediately after the source node based on the skew schedule. According to an embodiment of the present invention, the delay introduced is the negative of the corresponding delay value in the skew schedule. An example is illustrated in FIG. 5. In that example, the source skew schedule specifies that all paths starting from source node A and ending on an arbitrary destination node should be 100 ps slower than all paths starting from source node B and ending on an arbitrary destination node. Consequently, −100 ps is the delay introduced after source node A, and 0 delay is introduced after source node B, to reflect this source skew schedule. Alternatively, X delay can be introduced after source node A, and X+100 ps can be introduced after source node B, for any value X, to reflect the same source skew schedule because only relative delays matter in a skew schedule.

At 804, it is determined whether a skew constraint specifies relative delays between paths ending at different destination nodes (destination skew schedule). If a destination skew schedule is detected, control proceeds to 805. If a destination skew schedule is not detected, control terminates the procedure at 806.

At 805, for each appropriate destination node discussed in a destination skew schedule, a delay is introduced immediately before the destination node based on the skew schedule. According to an embodiment of the present invention, the delay introduced is the negative of the corresponding delay value in the skew schedule. This is similar to what is performed for a source skew schedule—which was already discussed. An example is illustrated in FIG. 5.

FIGS. 9(*a*)-(*e*) illustrate an example of how minimum and maximum connection delay budgets may be generated for a skew domain with a simple skew constraint according to an embodiment of the present invention. Complicated skew constraints can be handled using similar techniques as long as the respective timing graphs are modified according to respective skew schedules. FIG. 9(*a*) illustrates a timing diagram for a skew domain. Minimum achievable delay estimates are shown at the edges in the timing diagram. Given a maximum tolerable skew, S, of 10 ps, the maximum target delay and minimum target delay for the skew domain may be computed to be 1210 ps and 1200 ps, respectively.

FIG. 9(*b*) illustrates the long-path connection-level skew slacks and FIG. 9(*c*) illustrates short-path connection-level skew slacks generated from long-path timing analysis (with a 1210 ps requirement and delays equal to the minimum achievable delay estimates) and short-path timing analysis (with a 1200 ps requirement and delays equal to the minimum achievable delay estimates), respectively.

FIG. 9(*d*) illustrates the maximum connection delay budgets generated by a slack allocation procedure using long-path timing analyses and long-path connection-level slacks. FIG. 9(*e*) illustrates the minimum connection delay budgets generated by a slack allocation procedure using short-path timing analyses and short-path connection-level slacks.

FIGS. 10(*a*)-(*f*) illustrate an example of how minimum and maximum connection delay budgets may be generated for a skew domain with a skew schedule according to an embodiment of the present invention. In this example, the skew schedule specifies that all paths starting from node A and ending on an arbitrary node should be 100 ps slower than all paths starting from node B and ending on the arbitrary node. The skew schedule also specifies that all paths starting at an arbitrary node and ending at node E should be 200 ps slower than all paths starting at the arbitrary node and ending at node F. FIG. 10(*a*) illustrates a timing diagram for a skew domain. Minimum achievable delay estimates are shown beside their respective edges in the timing diagram.

The timing diagram shown in FIG. 10(*a*) may be modified as shown in FIG. 10(*b*) to reflect the skew schedule. The maximum path delay, M, is 1500 ps. Given a maximum tolerable deviation from the skew schedule, S, of 10 ps, the maximum target delay and minimum target delay for the skew domain may be computed to be 1510 ps and 1500 ps, respectively.

FIG. 10(*c*) illustrates the long-path connection-level skew slacks and FIG. 10(*d*) illustrates short-path connection-level skew slacks generated from long-path timing analysis (with a 1510 ps requirement and delays equal to the minimum achievable delay estimates) and short-path timing analysis (with a 1500 ps requirement and delays equal to the minimum achievable delay estimates), respectively.

Figure 10A:
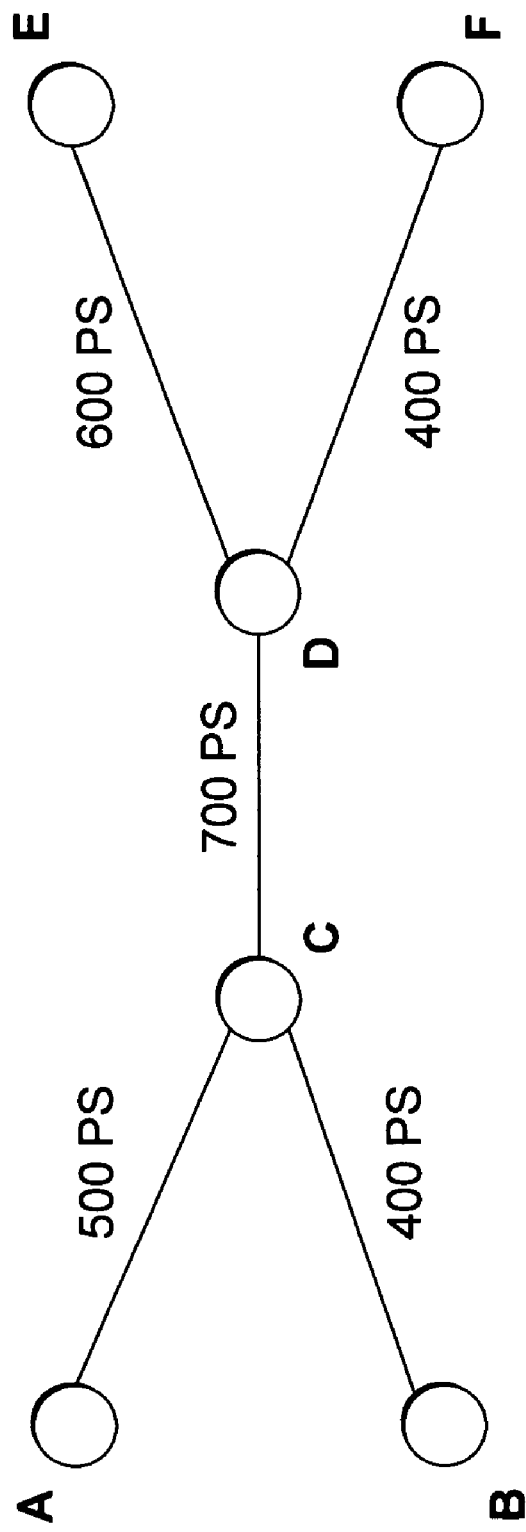
FIGS. 10(a)-(f) illustrate an example of how minimum and maximum connection delay budgets may be generated for a skew domain subject to a skew schedule according to an embodiment of the present invention.
Figure 10B:
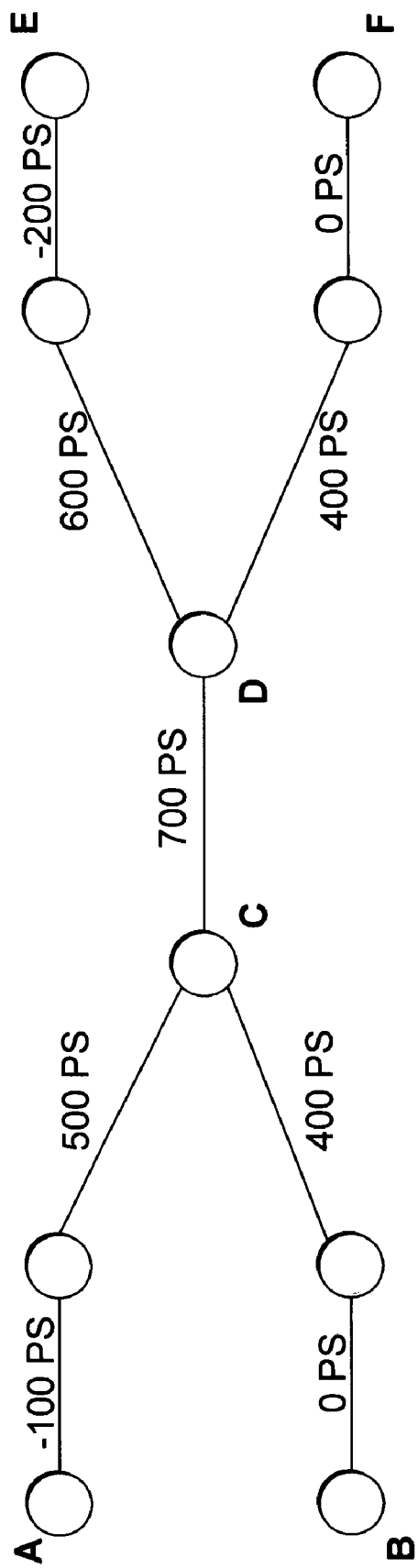
Figure 10C:
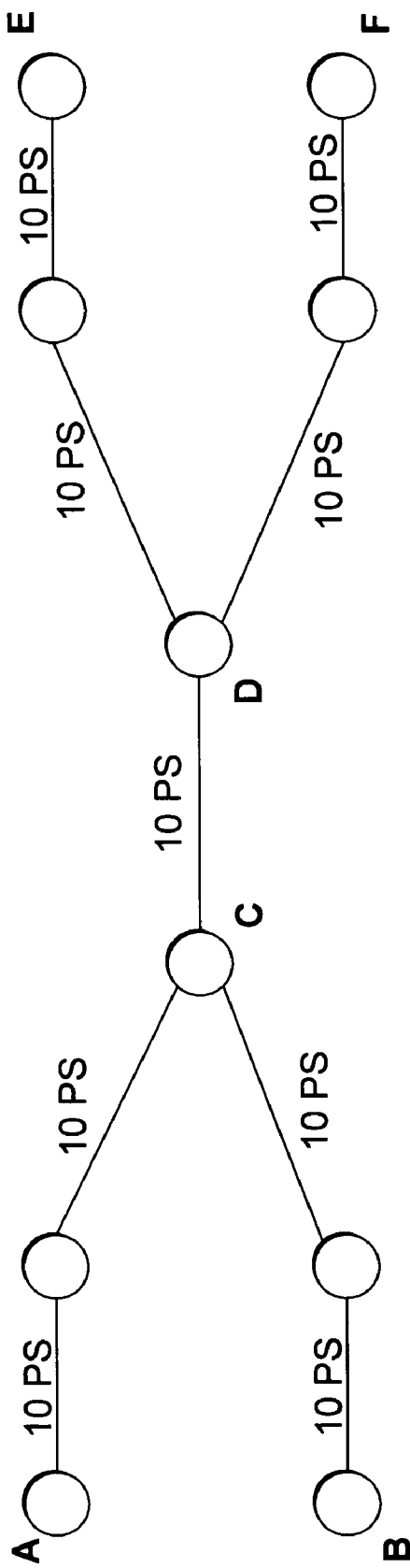
Figure 10D:
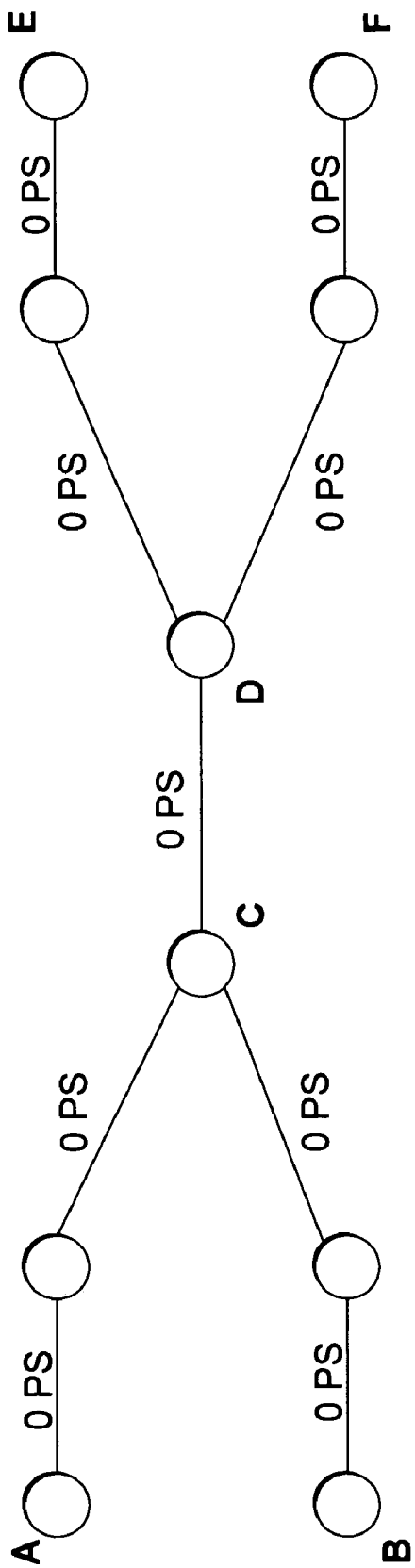
Figure 10E:
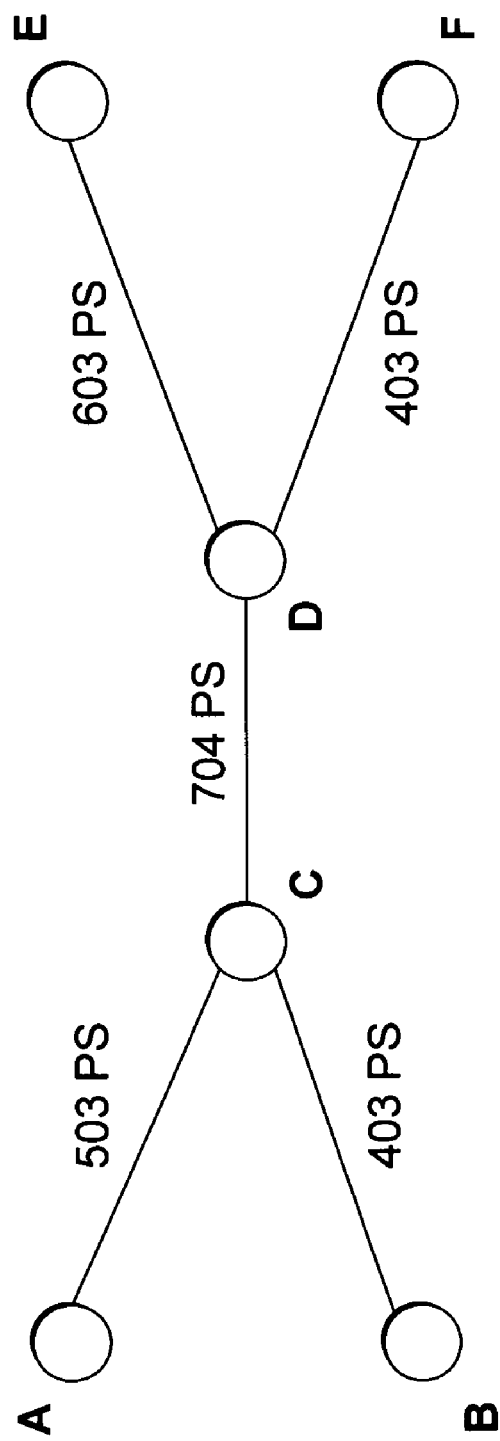
Figure 10F:
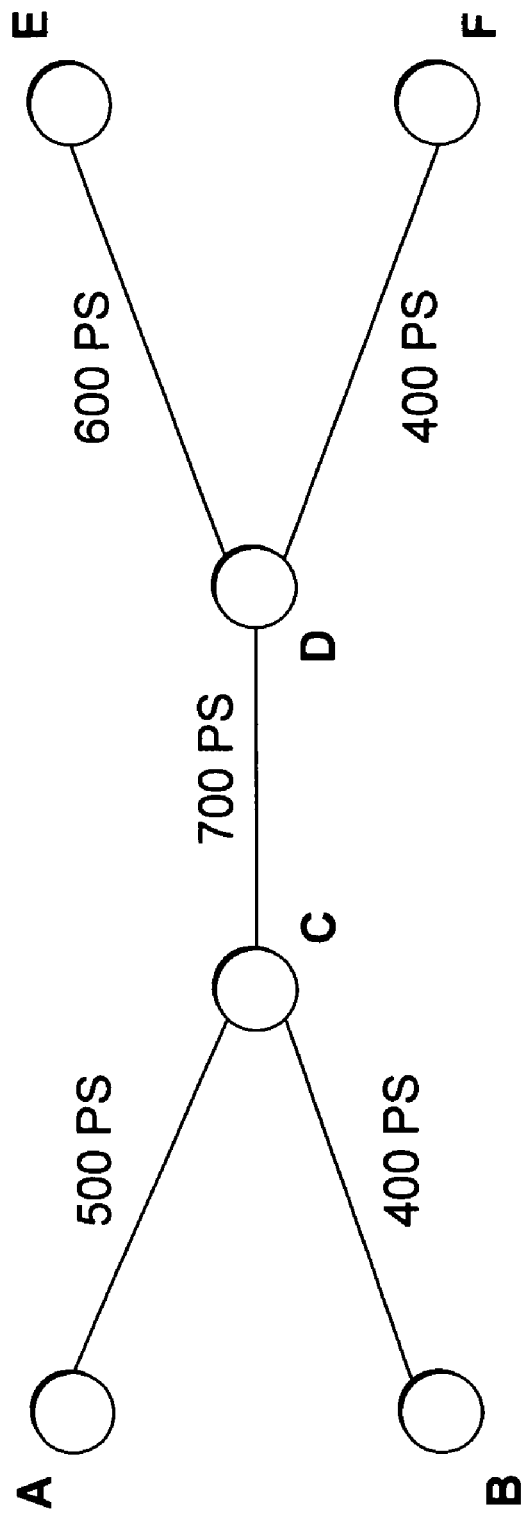

FIG. 10(e) illustrates the maximum connection delay budgets generated by a slack allocation procedure using long-path timing analyses and long-path connection-level slacks. FIG. 10(f) illustrates the minimum connection delay budgets generated by a slack allocation procedure using short-path timing analyses and short-path connection-level slacks.

Figure 11:
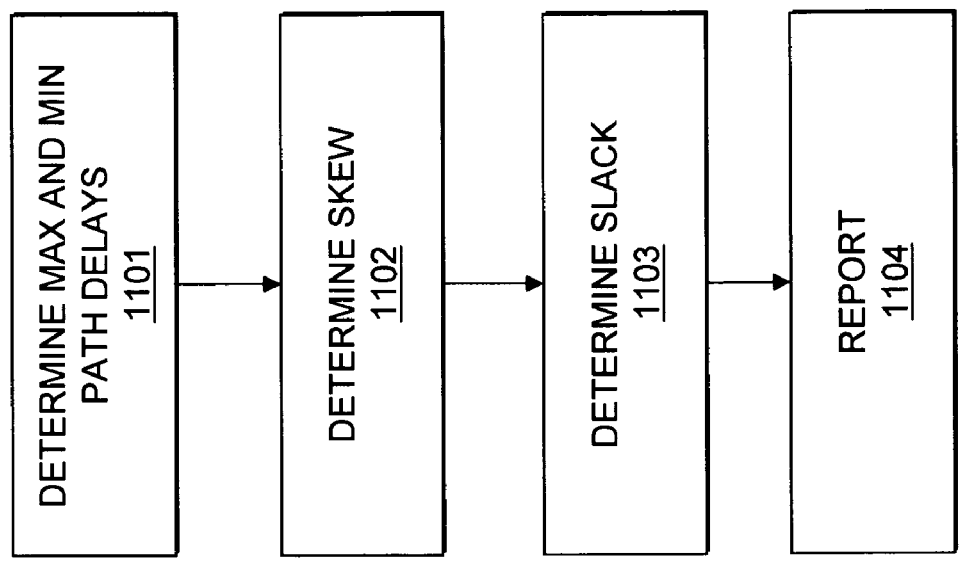
FIG. 11 illustrates a method for evaluating a design based on analyzing path-level skew in a system.

FIG. 11 illustrates a method for evaluating a design in terms of path-level skew (path-level skew analysis). According to an embodiment of the present invention, the procedure shown in FIG. 11 may be performed after synthesis, placement, and/or routing. At 1101, a maximum path delay and minimum path delay of all paths in a skew domain are determined using standard traversal techniques. According to an embodiment of the present invention, the path delays may be determined using a timing diagram for a skew domain subject to simple skew constraint or a modified timing diagram for a skew domain subject to a skew schedule.

At 1102, for a simple skew constraint, the skew of the paths in the skew domain is determined. This may be achieved by taking the difference of the maximum path delay and the minimum path delay identified at 1101. For a complicated skew constraint, this difference is the maximum deviation from the respective skew schedule.

At 1103, for simple skew constraints, the skew from 1102 is compared with a maximum tolerable skew (S) to determine the skew-domain worst slack (slack=S−skew). For complicated skew constraints, with an arbitrary skew schedule, the maximum deviation from the respective skew schedule from 1102 is compared with the maximum tolerable deviation from the skew schedule (S) to determine the skew-domain worst slack (slack=S−(maximum deviation from schedule)).

At 1104, results of the analysis are reported. According to an embodiment of the present invention, the results may be leveraged by a designer when manually repairing a design implementation to satisfy its respective constraints and/or re-designing the system to accommodate the skew present in the design implementation.

According to an alternate embodiment of the present invention, the N paths with the largest path delays and the N paths with the N smallest path delays in a skew domain (based on a timing graph for a simple skew constraint and a modified timing graph for a complicated skew constraint, whichever is appropriate) may be determined using known efficient techniques, where N may be any number. This information may also be reported to aid a designer. In some embodiments, the efficient techniques may not actually identify the N largest path delays because certain approximations are made for efficiency reasons—for example, only C paths per destination may be identified. However, in practice, such approximations are independent of the this discussion since the paths identified are usually of practical interest, and, if there are "approximations" in the paths identified, the resulting skew reports will be approximate along the same respective lines. Considering this, in another embodiment, from those N largest delay paths and N smallest delay paths, $N^2$ pairs of paths with their corresponding skew values (or deviations) may be conceptually identified. From those $N^2$ pairs of paths, the N pairs of paths with the largest skew values or deviations may be reported to the designer. The N pairs of paths with the largest skew values may be determined by sorting the $N^2$ pairs according to their corresponding skew values (or deviations), in $N^2 \times \log(N)$ time and $N^2$ space, or by using the following procedure that runs in $N \times \log(N)$ time and N space. A data structure (A) can be created to associate each of the N smallest delay paths with one of the N largest delay paths. In one embodiment, this data structure can be an array indexed by the ID of the smallest delay path, and storing values that correspond to the IDs of the longest delay paths. Initially, each of the N smallest delay paths will be associated with the largest delay path. The corresponding N starting skew values or deviations can be computed and the smallest delay paths, along with their corresponding skew values, can be inserted into a heap (H) arranged according to skew values. The heap data structure allows $\log(N)$-time retrieval of the largest skew value inserted in the heap and the corresponding smallest delay path. After the formation of the heap, the algorithm begins by removing the largest skew value from the heap, recording the corresponding smallest delay path and the corresponding largest delay path (the corresponding largest delay path is found by looking at the appropriate entry in A); the corresponding pair can be recorded as the pairing with the worst skew (or deviation). After that, the respective entry in A can be updated to point to the next largest delay path, and the corresponding largest skew value for that new pairing can be computed and inserted in the heap in $\log(N)$-time. Then the process can be repeated until the N worst pairs of paths (with respect to skew) are determined.

FIGS. 6-8, and 11 are flow charts illustrating methods according to embodiments of the present invention. The techniques illustrated in these figures may be performed sequentially, in parallel, or in an order other than that which is described. It should be appreciated that not all of the techniques described are required to be performed, that additional techniques may be added, and that some of the illustrated techniques may be substituted with other techniques.

The techniques above have been described with reference to designing a field programmable gate array. It should be appreciated that the techniques (for synthesis, placement, routing, etc.) may be used in any CAD tool for the creation/processing/optimization/implementation of any logic design, such as that encountered in the creation of application specific integrated circuits (ASICs), etc.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium" or "machine readable medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system, comprising:
    optimizing path-level skew in the system by generating connection-level long-path and short-path skew slacks for one or more skew domains given one of a tolerable maximum skew and a tolerable deviation from a skew schedule for each skew domain; and
    performing one of synthesis, placement, and routing of the system on a target device using a strategy generated from the optimized path-level skew, wherein at least one of the optimizing and performing procedures is performed by a processor.

2. The method of claim 1, wherein generating connection-level long-path and short-path skew slacks comprises assuming intra-corner delay variation.

3. The method of claim 1, wherein generating connection-level long-path and short-path skew slacks comprises using amalgamated timing data from more than one timing corner.

4. The method of claim 1, wherein generating the connection-level long-path and short-path skew slacks comprises identifying a longest path delay in a skew domain.

5. The method of claim 4, wherein identifying the longest path delay in a skew domain comprises performing a traversal of a timing graph.

6. The method of claim 4, wherein identifying the longest path delay in a skew domain comprises using minimum achievable delays or minimum achievable delay estimates for components and connections in the system.

7. The method of claim 6, wherein the minimum achievable delays or minimum achievable delay estimates are determined to satisfy short-path timing constraints.

8. The method of claim 4, wherein a longest path delay is identified for each timing corner from a multiplicity of timing corners, for each skew domain.

9. The method of claim 1, further comprising identifying an absolute maximum target delay for the skew domain and an absolute minimum target delay for the skew domain.

10. The method of claim 9, further comprising generating the connection-level long-path skew slacks from a long-path timing analysis based on a set of connection delays and the absolute maximum target delay for the skew domain.

11. The method of claim 9, further comprising generating the connection-level short-path skew slacks from a short-path timing analysis based on a set of connection delays and the absolute minimum target delay for the skew domain.

12. The method of claim 9, further comprising generating the absolute maximum target delay based on a longest path delay identified for the skew domain.

13. The method of claim 12, further comprising generating the maximum target delay to be greater than or equal to the longest path delay identified for the skew domain.

14. The method of claim 12, further comprising increasing the maximum target delay to improve the likelihood of satisfying the maximum target delay.

15. The method of claim 12, further comprising increasing the maximum target delay to satisfy short-path timing constraints.

16. The method of claim 12, further comprising minimizing the maximum target delay to decrease the absolute skew of the final system due to percentage error in delay modeling.

17. The method of claim 12, further comprising decreasing the maximum target delay to satisfy long-path timing constraints.

18. The method of claim 9, further comprising generating the minimum target delay based on the maximum target delay and the tolerable maximum skew or tolerable deviation from the skew schedule.

19. The method of claim 9, further comprising generating minimum and maximum target delays based on the longest path delays computed for more than one timing corner, for each skew domain.

20. The method of claim 19, further comprising generating one minimum and maximum target delay pair for each timing corner from a multiplicity of timing corners to maximize a valid timing window that considers all relevant corners.

21. The method of claim 1, further comprising generating maximum and minimum delay budgets from connection-level long-path and short-path skew slacks.

22. The method of claim 1, wherein optimizing the path-level skew is performed with respect to synthesis.

23. The method of claim 1, wherein optimizing the path-level skew is performed with respect to mapping.

24. The method of claim 1, wherein optimizing the path-level skew is performed with respect to placement.

25. The method of claim 1, wherein optimizing the path-level skew is performed with respect to routing.

26. The method of claim 1, wherein the system being designed is a logic design.

27. The method of claim 26, wherein the logic design is to be implemented in a field-programmable gate array (FPGA).

28. The method of claim 1, wherein optimizing the path-level skew is performed with respect to multiple timing corners.

29. The method of claim 1, wherein optimizing the path-level skew is performed with respect to intra-corner delay variation.

30. An article of manufacture comprising a machine accessible non-transitory medium including sequences of instructions, the sequences of instructions including instructions which when executed cause the machine to perform:
    optimizing path-level skew in a system by generating connection-level long-path and short-path skew slacks for one or more skew domains; and
    performing one of synthesis, placement, and routing of the system on a target device using a strategy generated from the optimized path-level skew.

31. The article of manufacture of claim 30, wherein generating the connection-level long-path and short-path skew slacks for one or more skew domains is achieved given a tolerable maximum skew or a tolerable deviation from a skew schedule for each skew domain.

32. The article of manufacture of claim 31, wherein generating connection-level long-path and short-path skew slacks comprises assuming intra-corner delay variation.

33. A method for designing a system, comprising:

generating connection-level long-path and short-path skew slacks for one or more skew domains given one of a tolerable maximum skew and a tolerable deviation from a skew schedule for the one or more skew domains;

generating maximum and minimum delay budgets from the connection-level long-path and short-path skew slacks; and performing one of synthesis, placement, and routing of the system on a target device using a strategy generated from the maximum and minimum delay budgets, wherein at least one of the generating and performing procedures is performed by a processor.

34. The method of claim 33, further comprising identifying an absolute maximum target delay for the one or more skew domains and an absolute minimum target delay for the one or more skew domains.

35. The article of manufacture of claim 30, wherein the system is a logic design implemented on a field programmable gate array.

36. The method of claim 33, wherein the system is a logic design implemented on a field programmable gate array.

* * * * *